United States Patent
Kengeri et al.

[19]

[11] Patent Number: 6,137,746
[45] Date of Patent: Oct. 24, 2000

[54] HIGH PERFORMANCE RANDOM ACCESS MEMORY WITH MULTIPLE LOCAL I/O LINES

[75] Inventors: Subramani Kengeri, Cupertino; Chitranjan N. Reddy, Los Altos Hills, both of Calif.

[73] Assignee: Alliance Semiconductor Corporation, Santa Clara, Calif.

[21] Appl. No.: 09/363,083

[22] Filed: Jul. 28, 1999

[51] Int. Cl.$^7$ ........................................ G11C 8/00
[52] U.S. Cl. ........................ 365/230.03; 365/194
[58] Field of Search .................. 365/230.03, 207, 365/194, 100, 102, 196, 230.05

[56] References Cited

U.S. PATENT DOCUMENTS

| | | | |
|---|---|---|---|
| 5,274,595 | 12/1993 | Seok et al. ......................... | 365/203 |
| 5,617,555 | 4/1997 | Patel et al. ........................ | 395/432 |
| 5,910,927 | 6/1999 | Hamamoto et al. ................ | 365/230.03 |
| 5,923,605 | 7/1999 | Mueller et al. .................... | 365/230.03 |

*Primary Examiner*—David Nelms
*Assistant Examiner*—Thong Le
*Attorney, Agent, or Firm*—Beyer Weaver & Thomas, LLP

[57] ABSTRACT

The present invention provides an apparatus and a method of reducing the time to drive the I/O lines by the sense amplifiers. In one embodiment of the present invention, local sense amplifier segments and associated local I/O lines are provided. The I/O lines are short in length and are connected to the sense amplifiers in the associated sense amplifier segments. The reduction in the length of the local I/O lines reduce the effective RC impedance of the I/O lines. Thus, the local sense amplifiers are smaller and drive the local I/O lines much faster. The present invention further provides global I/O lines connected to the local I/O lines. In a second embodiment of the present invention, the global I/O lines are driven by a second stage amplifier. In a third embodiment of the present invention, one global I/O line is provided for every local I/O line.

21 Claims, 11 Drawing Sheets

HIGH PERFORMANCE RANDOM ACCESS MEMORY WITH MULTIPLE LOCAL I/O LINES

BACKGROUND OF THE INVENTION

1. Field of the Invention

The present invention relates to Random Access Memories (RAMs). Specifically, it relates to high speed, high density DRAMs.

2. Discussion of the Related Art

Today's electronic systems, specially computer systems, require high speed, high density memories. The increase in the capacity of the memories is directly proportional to their physical size. However, the trend is toward smaller systems that require smaller components, such as memory. Memory designers and manufacturers are constantly thriving to design high speed and high density memories without increasing the overall physical size of the memories.

The existing memory types include read only memory, flash memory, random access memory, etc. For the purposes of the present invention, we will discuss the architecture of a Random Access Memory ("RAM").

A conventional RAM includes memory array that is arranged in rows and columns of memory cells. The memory array further includes a word line associated with each row and a pair of complementary bit lines associated with each column of memory cells. By asserting the appropriate word line and bit lines, the information stored in a memory cell can be read or information can be written in to the memory cell.

In a typical read operation the information stored in a memory cell is transferred to the associated bit line. The information is then sensed by a sense amplifier and is placed on the I/O line. Typically, a pair of complementary I/O lines are used in the random access memories. In addition, there is one sense amplifier for every pair of bit lines.

As mentioned above, an increase in the number of memory cells results in an increase in the physical size of the die, thus increasing the physical size of the memory chip. In addition, as the number of memory cells in a memory chip increases, so does the physical length of the I/O lines.

To place the information, such as data, on an I/O lines, the associated sense amplifier must drive the I/O line. The speed by which each I/O line is driven is determined by its impedance. The impedance of an I/O line is determined by its inherent resistance, its inherent capacitance, and the capacitance of the pass transistors that are connected between the sense amplifier and the I/O line. The inherent resistance and capacitance of the I/O line depends on the material used to implement the I/O line and its physical shape. The longer is the length of an I/O line, the higher are the inherent capacitance and resistance of the I/O line.

On the other hand, an increase in the number of memory cells results in an increase in the number of sense amplifiers that are connectable to the I/O line via pass transistors. Thus, the total capacitance that is connected to the I/O lines increases.

Consequently, an increase in the number of memory cells associated with an I/O line results in an increases in the length of the I/O line and the number of pass transistors connected to the I/O line. Hence, the impedance of the I/O line as seen by the associated sense amplifiers increases. This means that the speed by which the sense amplifiers can drive the I/O lines decreases, which reduces the speed of the memory chip.

In view of the above, it is clear that high density and high speed memories require an architecture that allows for the increase in the capacity of the memory without a decrease in the performance speed.

SUMMARY AND OBJECTIVES OF THE INVENTION

It is an object of the present invention to provide a random access memory in which the I/O lines are driven much faster.

It is another object of the present invention to provide a random access memory in the I/O lines are driven faster, wherein the decrease in the time to drive the I/O lines achieved by arranging the memory cells in a plurality of memory segments and by providing a local I/O line associated with each memory segment.

It is another object of the present invention to provide a random access memory in the I/O lines are driven faster, wherein the decrease in the time to drive the I/O lines achieved by arranging the memory cells in a plurality of memory segments, by providing a local I/O line with a substantially smaller impedance associated with each memory segment, and by providing a sense amplifier associated with each local I/O line to drive the I/O line.

According to the present invention, a random access memory in which the I/O lines are driven much faster is described. The random access memory of the present invention includes a plurality of memory banks. Each memory bank includes memory cells that are arranged in rows and columns. The intersection of a row and a column defines a memory cell. Each memory bank further includes word lines and bit lines. The random access memory of the present invention further comprises a plurality of sensing banks, each associated with a memory bank. Each sensing bank includes a plurality of local sensing banks, also called local sense amplifier segments or sub-banks. The random access memory of the present invention further includes a plurality of local input/output (I/O) lines each associated with one of the local sensing banks. The effective RC impedance of each local I/O line is less than the effective RC impedance of an I/O line equivalent to the aggregate of all local I/O lines.

The random access memory of the present invention further includes a plurality of global input/output (I/O) lines. Each global I/O line is coupled to the local I/O lines that are associated with a single column of the local sensing banks.

In the random access memory of the present invention, each local sensing bank includes a plurality of sense circuitry. Each sense circuitry is coupled between a pair of bit lines and the associated local I/O line.

In a second embodiment of the present invention, the random access memory of the present invention further includes a plurality of amplification circuitry. Each amplification circuitry is coupled between a local I/O line and the global I/O line coupled to the local I/O line. Each amplification circuit is provided in an area between the two adjacent local sensing banks.

In a third embodiment of the present invention, the random access memory includes one global I/O line connected to a local I/O line. Each global I/O line is coupled to an associated local I/O line through an amplification circuitry.

DETAILED DESCRIPTION OF THE EMBODIMENTS

The present invention provides a solution to the problem caused by the incxrease in the length of the I/O lines in high density memories. In the following paragraphs, the like elements are designated with the same reference designation.

Figure 1:
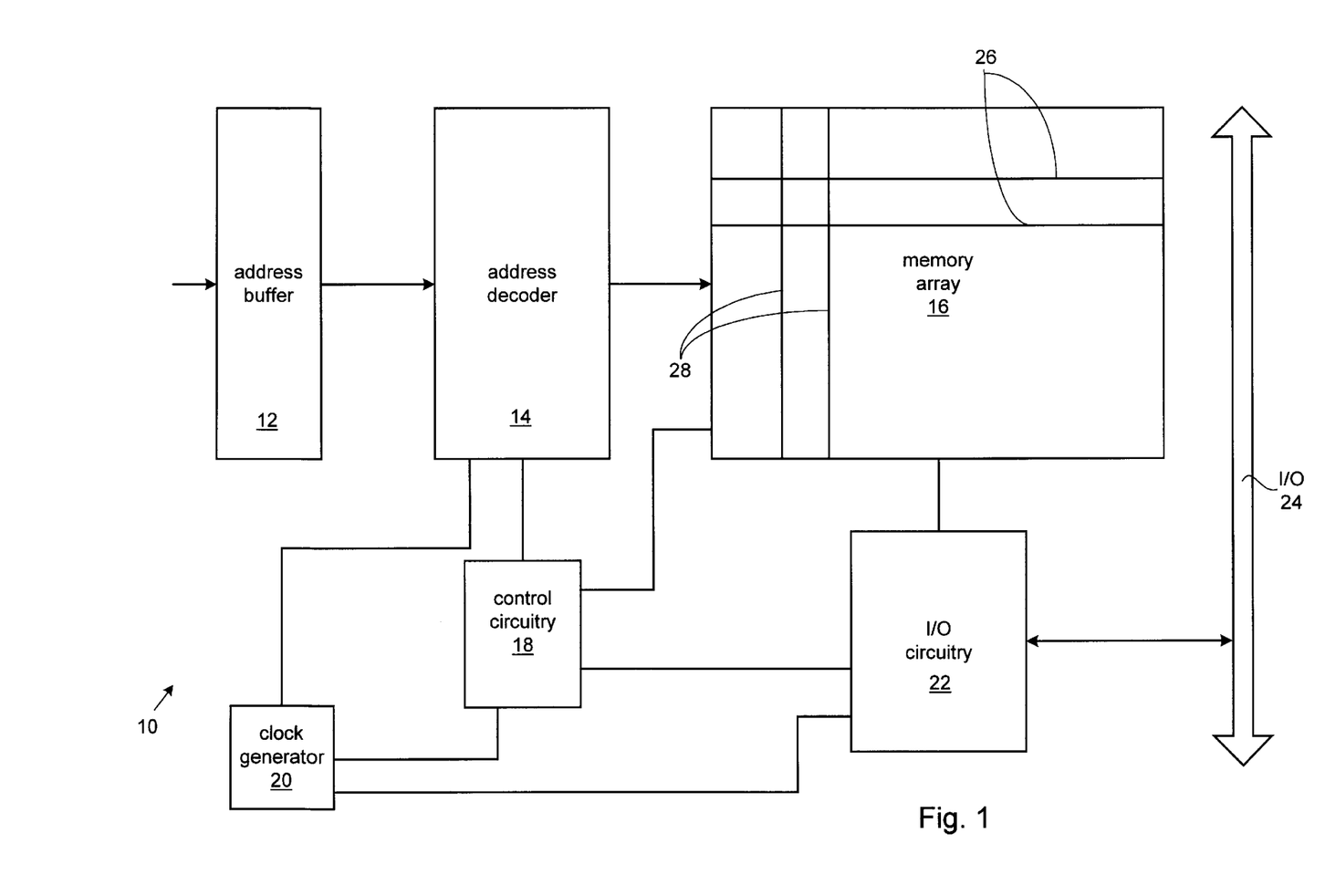
FIG. 1 is a block diagram of a RAM incorporating the present invention.

Referring to FIG. 1, a block diagram of a RAM 10 incorporating the present invention is illustrated. Ram 10 includes an address buffer 12, an address decoder 14, a memory array 16, a control circuitry 18, a clock generator 20, an I/O circuitry 22, and I/O lines 24. Memory array 16 includes memory cells (not shown) that are arranged in rows and columns. The intersection of each row and column defines a memory cell. Memory array 16 further includes word lines 26 and bit lines 28. Bit lines 28 are provided in complementary pairs. Each bit line is associated with one word line. This means that each bit line is connected to the memory cells activated by the associated word line. For the sake of simplicity, a pair of word lines 26 and a complementary pair of bit lines 28 are shown in FIG. 1. For example, the top word line 26 could be associated with the first bit line from the left. This means that the content of the memory cell activated by the top word line will be connected to the left bit line 28. It is understood that memory array 16 can have as many word line 26 as the rows of memory cell and as many complementary pairs of bit lines 28 as the columns of memory cell.

Each memory cell within memory array 16 is accessed by addressing the memory cell using an externally generated memory address. The external address is received by the address decoder 14 through address buffer 12. The address is then decoded by address decoder 14 to generate a word line select signal and a column select signal. The word line select signal activates all the memory cells in a selected row. Once the memory cells are activated, depending on the desired operation, i.e., a read or write operations, the content of the memory cells can either be read or information can be written in to one of the activated cells.

The column select signal generated by the address decoder 14 enables accessing the information present on the bit line associated with the activated word line. In a read operation, the content of selected memory cell that is transferred to the bit line 28 is sensed and transferred to the I/O line 24. In a write operation, the information on the I/O line 24 is written in to the selected memory cell.

As discussed above, the high density random access memories face the problem of having sense amplifiers driving I/O lines with large input impedance caused by their physical length. The present invention solves this problem by substantially reducing the length of the I/O lines that are driven by each sense amplifier. A substantial reduction in the length of an I/O line substantially reduces its input impedance, allowing the associated sense amplifier to drive the I/O line faster.

Figure 2:
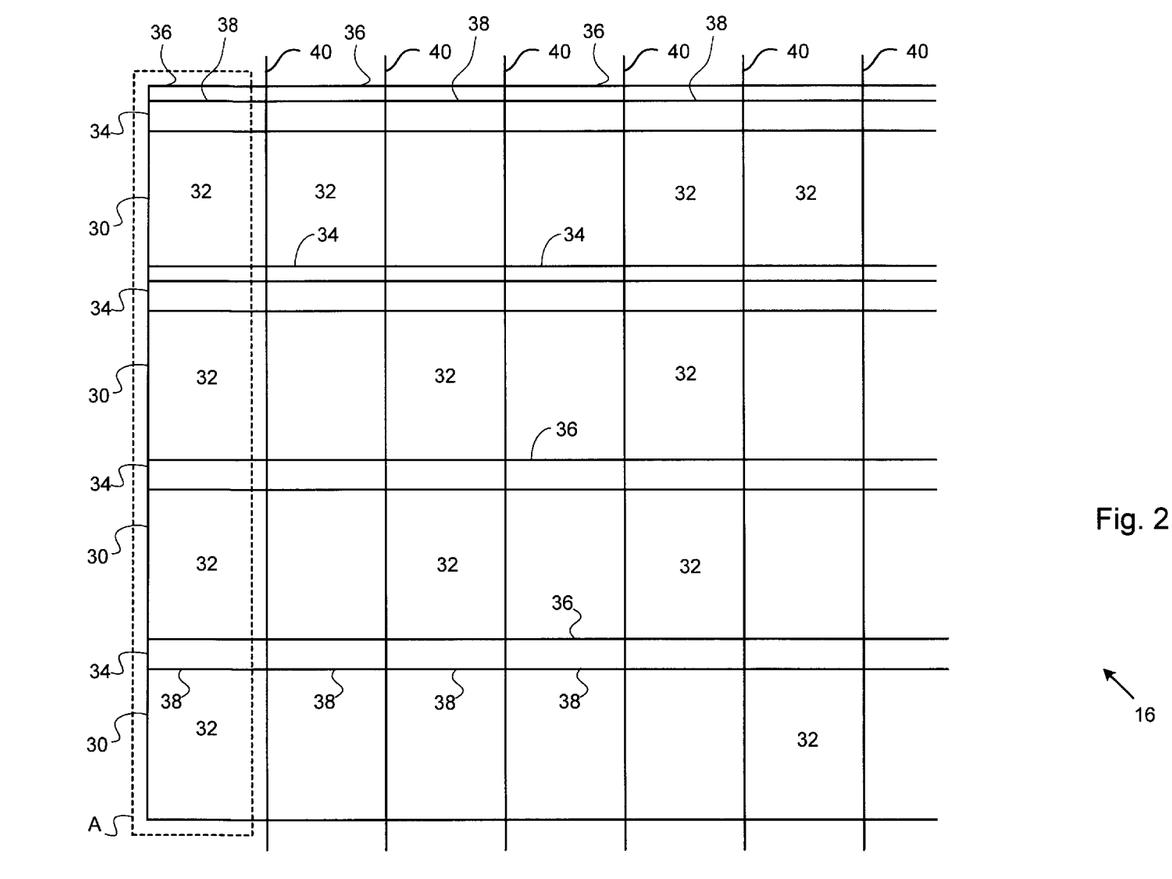
FIG. 2 is a more detailed block diagram of the memory array according to the present invention.
Figure 3:
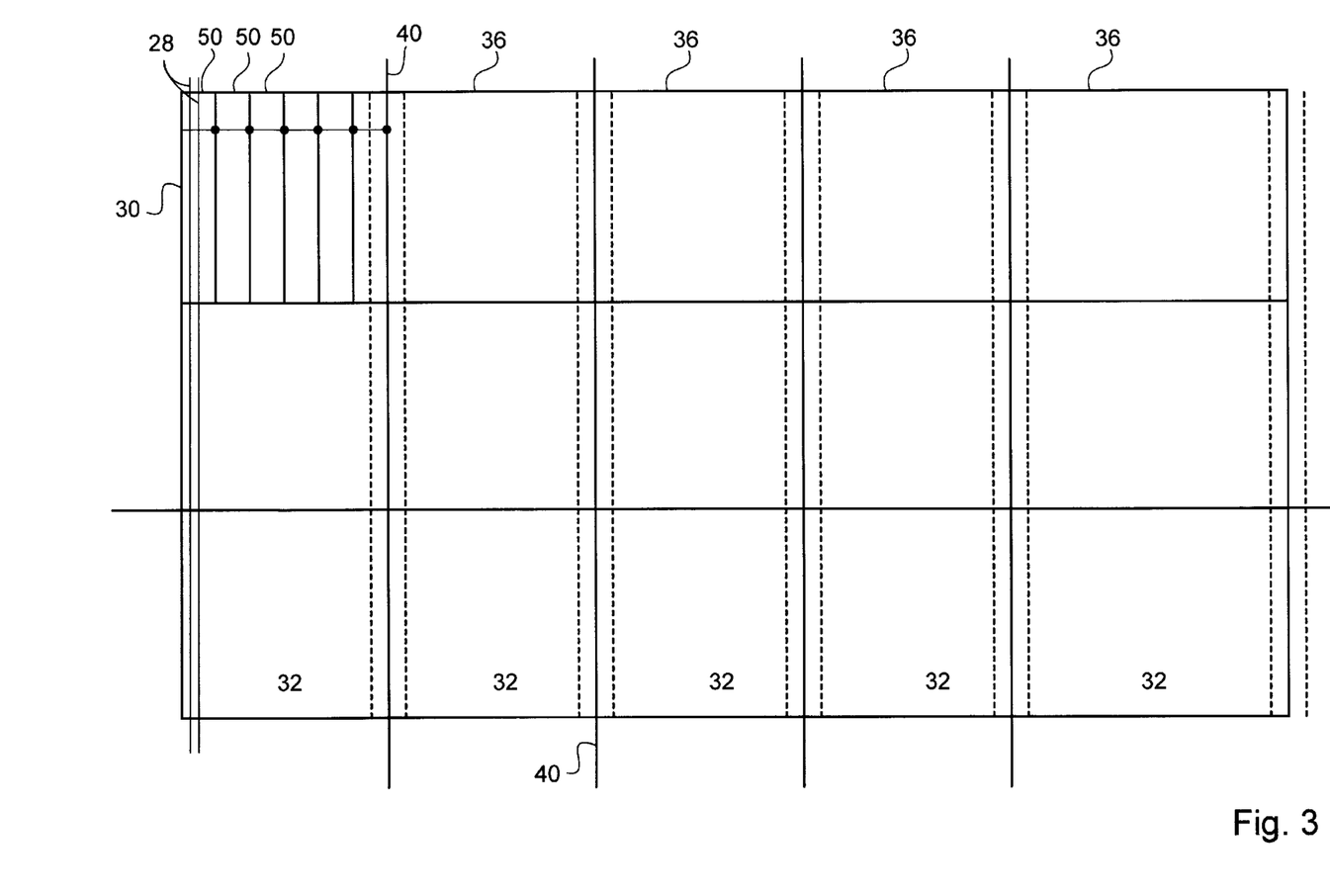
FIG. 3 is a block diagram of a single memory bank of the memory of FIG. 2.
Figure 4:
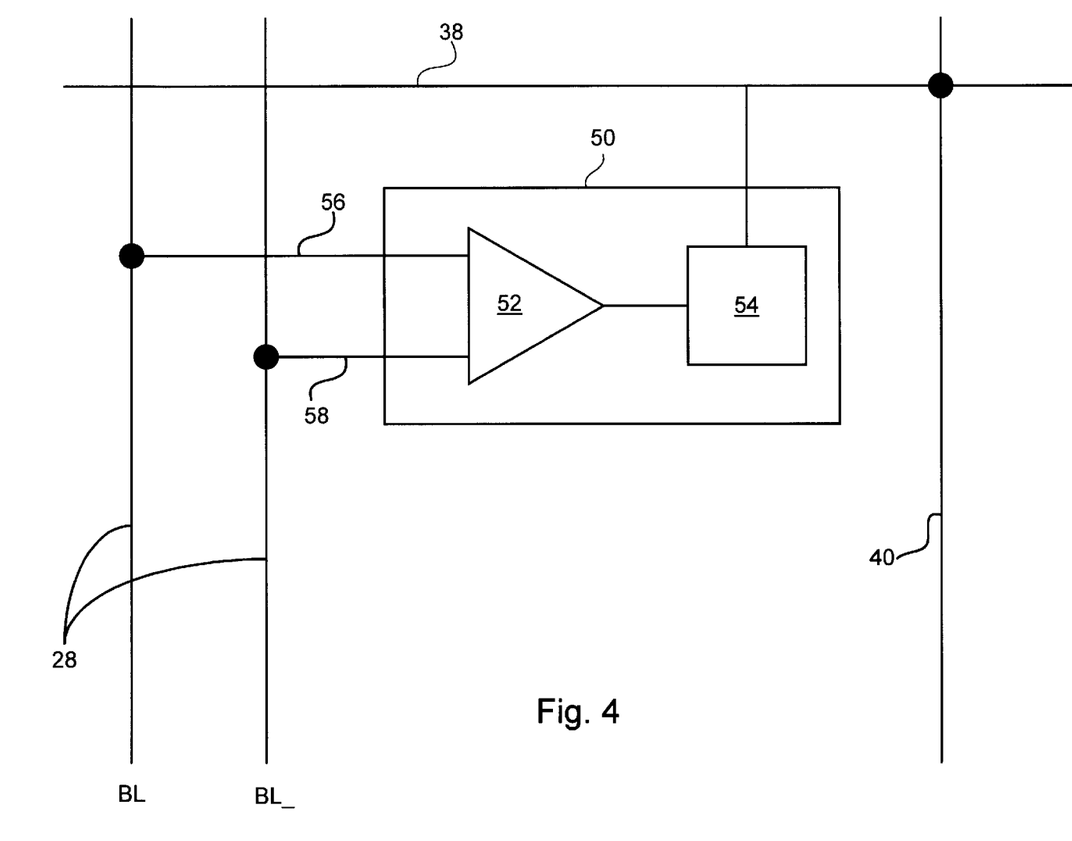
FIG. 4 is a schematic diagram that illustrates a typical connection between the sense amplifier and the local I/O lines according to the first embodiment of the present invention.

The first embodiment of the present invention is illustrated in FIGS. 2–4. A more detailed block diagram of the memory array 16 is illustrated in FIG. 2. FIG. 3 is a block diagram of an exemplary memory bank of FIG. 2. FIG. 4 is a schematic diagram in which a typical connection between the sense amplifier, a local I/O line, and a global I/O line according to the first embodiment of the present invention is illustrated.

Referring to FIG. 2, memory array 16 includes a plurality of memory banks 30. Each memory bank 30 includes a plurality of memory segments 32. Each memory bank 30 is associated with a sense amplifier bank 34. Each sense amplifier bank 34 includes a plurality of local sense amplifier segments 36. Each local sense amplifier segment 36 is associated with a memory segment 32 of the memory bank corresponding to the particular sense amplifier bank 34.

As it is further illustrated in FIG. 2, there is one local I/O line 38 provided for each local sense amplifier segment 36. In addition, Memory array 16 includes a global I/O line 40 that is connected to the local I/O lines 38 associated with a column of memory segments 32. For example, the first global I/O 40, the first from the left shown in the figure, is connected to the local I/O lines 38 associated with memory segments 32 that are grouped in box A.

It is apparent to one knowledgeable in the art that memory 16 can include more than four memory banks that are shown in FIG. 2. Furthermore, each memory bank could include more than six memory segments that are shown in FIG. 2. FIG. 2 is provided for illustrative purposes and should not be considered as a limiting factor.

FIG. 3 is the block diagram of a memory bank 30. As described above, memory bank 30 includes memory segments 32. Each memory segment 32 is associated with a local sense amplifier segment 36 and a local I/O line 38. Each local sense amplifier segment 36 includes a plurality of sense amplifiers 50. The output of each sense amplifier 50 is connected to the associated local I/O line 38. The number of sense amplifiers 50 in each local sense amplifier segment 36 depends on the number of memory cells in the corresponding memory segment 32. For example, if memory segment 32 includes 128 memory cells, the number of sense amplifier 50 will also be 128.

As it is further illustrated in FIG. 3, each local I/O line 38 is connected to a global I/O line 40. As mentioned before with respect to FIG. 1, memory array 16 includes one pair of complementary bit lines 28 for each column of memory cells. For illustration purposes, a pair of complementary bit lines 28 are also shown in FIG. 3.

FIG. 4 is a schematic diagram in which the connection between a sense amplifier 50, a local I/O line 38, and a global I/O line 40 according to the first embodiment of the present invention is illustrated. Sense amplifier 50 includes a differential amplifier 52 and a latch 54. The first and second inputs of the differential amplifier 52, inputs 56 and 58, are connected to the bit line (BL) and inverse bit line (BL__) of the complementary bit line pair 28. It should be mentioned during a read or write operation, the information is present on either BL or BL__. If the information, such as data, is present on BL, the voltage on BL__ will be at a set voltage level. such as Vcc/2. On the other hand, if the information is present on BL__, the voltage on BL will be at the set voltage level. In the present invention, the set voltage level is equal to one half of the supply voltage(i.e., Vcc/2).

The output of the differential amplifier is connected to the input of latch 54. The output of the latch 54 is the output of the sense amplifier 50 and represents the sensed information, such as information. Latch 54 drives the local I/O line 38 to deliver the sensed information on to the local I/O line.

In a read operation, the differential amplifier 52 differentially senses the voltage on BL and BL__. As mentioned above, the voltage on one of the two bit lines represent the information stored in the addressed memory cell. The sensed information is then latched in latch 54. Latch 54 then drives local I/O line 38. The information present on local I/O line 38 is also present on global I/O line 40.

Next, the operation of the random access memory 10 that includes memory array 16 of FIG. 2 will be discussed by referring to FIGS. 1–4. For illustration purposes, a read operation will be described.

In operation, address decoder 14 decodes the external address to generate a row select signal and a column select signal. The row select signal causes the information stored in the memory cells in the selected row to be placed on the corresponding bit line 28. The information on the bit line 28 is then sensed by the corresponding sense amplifier 50. The column select signal generated by the address decoder 14 determines which memory cell in the selected row is selected. Once this signal is activated, the sense amplifier associated with the selected memory cell will drive the corresponding local I/O line 38. The information is also present on the global I/O line 40 that is connected to the local I/O line 38.

Figure 5:
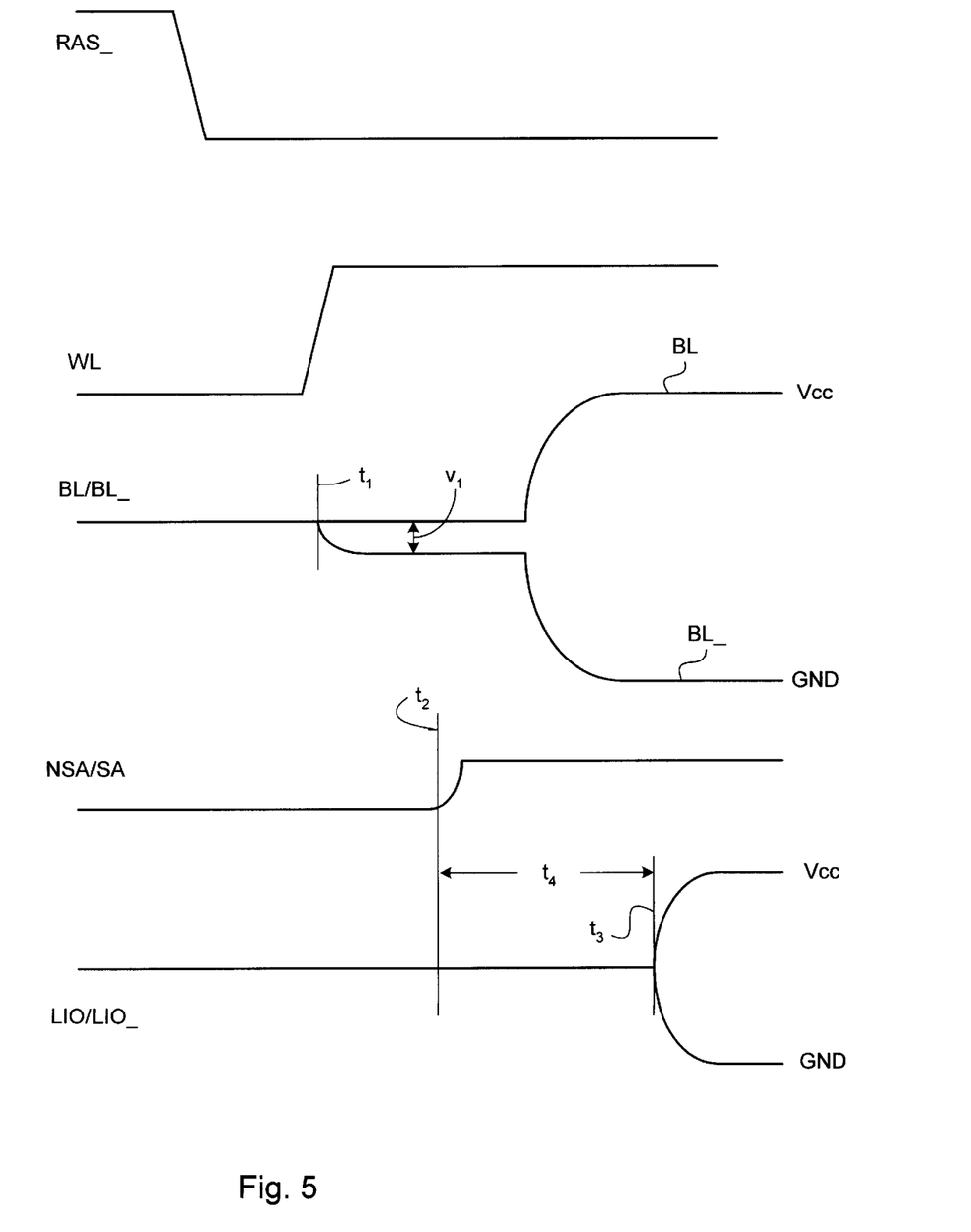
FIG. 5 is a timing diagram corresponding to a typical read operation in a random access memory including the first embodiment of the present invention.

Referring now to FIG. 5, a timing diagram corresponding to a typical read operation is illustrated. As shown in FIG. 5, the read operation starts with the active low RAS__ signal activated. Next, the WL signal goes high to activate the memory cells associated with the particular word line. Thereafter, at time t1, the information stored in the selected memory cell will be placed on BL, or BL__. As mentioned above, either BL or B__ is associated with the activated word line.

In the FIG. 5, the information is shown to be present on BL__. The stored information is represented by v1, which is the difference between the voltages on the BL and BL__. At time t2, the SA signal goes high to trigger the sensing of the information on BL__. As mentioned above, the voltages on BL and BL__ are differentially sensed. At time t3, the sensed information is placed on local I/O and local I/O__(LI/O and LI/O__). As mentioned above, the present invention reduces the time it takes to drive the I/O lines. This time is represented by t4 in FIG. 5.

Referring again to FIG. 3, the sense amplifier 50 drives a short local I/O line 38. Since the length of the local I/O line 38 is substantially shorter than the length of an I/O equal to the aggregate length of all the local I/O lines in a row, the input impedance of local I/O line as seen by the sense amplifier 50 is substantially reduced. Thus, sense amplifier 50 can now drive the local I/O line 38 much faster. In addition, since a substantially smaller load is being driven by each sense amplifier 50, a smaller sense amplifier suffices. Accordingly, the present invention not only drives the local I/O lines much faster than the presently available approach, it achieves this by using a relatively small sense amplifier. A reduction in the size of the sense amplifiers 50 results in a reduction in the overall size of the memory chip.

It should be noted that in the present invention, the length of the local I/O lines 38 is independent of the size of the memory array 16. That is the length each local I/O line 38 can be kept constant regardless of the size of the memory array 16.

As mentioned above, the information on local I/O lines 38 are also present on the corresponding global I/O line 40. Each global I/O line 40 is connected to all the local I/O lines 38 in a column of memory segments 32. This means that for every column of memory segment 32 there is one global I/O line 40.

In the present invention, the global I/O lines are provided in a conductive layer that is parallel to the bit line layer. Similar to the local I/O lines, the global I/O lines are also provided in complementary pairs. The advantage of providing the global I/O lines in this conductive layer is threefold. First, The global I/O lines are provided on a conductive layer parallel to the semiconductor die. Thus, the global I/O lines are provided without increasing the size of the semiconductor die, i.e., they are provided for free. Second, by routing the global I/O lines in parallel to the memory array (core), the effective length of the global I/O lines are minimized. The alternative would be to provide the global I/O lines by routing them around the core area. This would result in longer I/O lines with larger effective RC impedance. Third, the material for this conductive layer can be selected to minimize the sheet resistance of the conductive layer, thus substantially reducing the total resistance of each global I/O line 40. Accordingly, the effective impedance of the global I/O lines 40 will be relatively small and negligible.

The second embodiment of the present invention provides an alternative scheme to further decrease the time by which the I/O lines are driven. The second embodiment of the present invention utilizes a second amplifier provided between the local I/O lines 38 and the associated global I/O lines 40 to further speed up the operation of the memory 16. As it will be apparent from the following paragraphs, the present invention provides the second stage amplifiers without any increase to the size of the semiconductor die. This is important in the high capacity, high speed memories.

Figure 6:
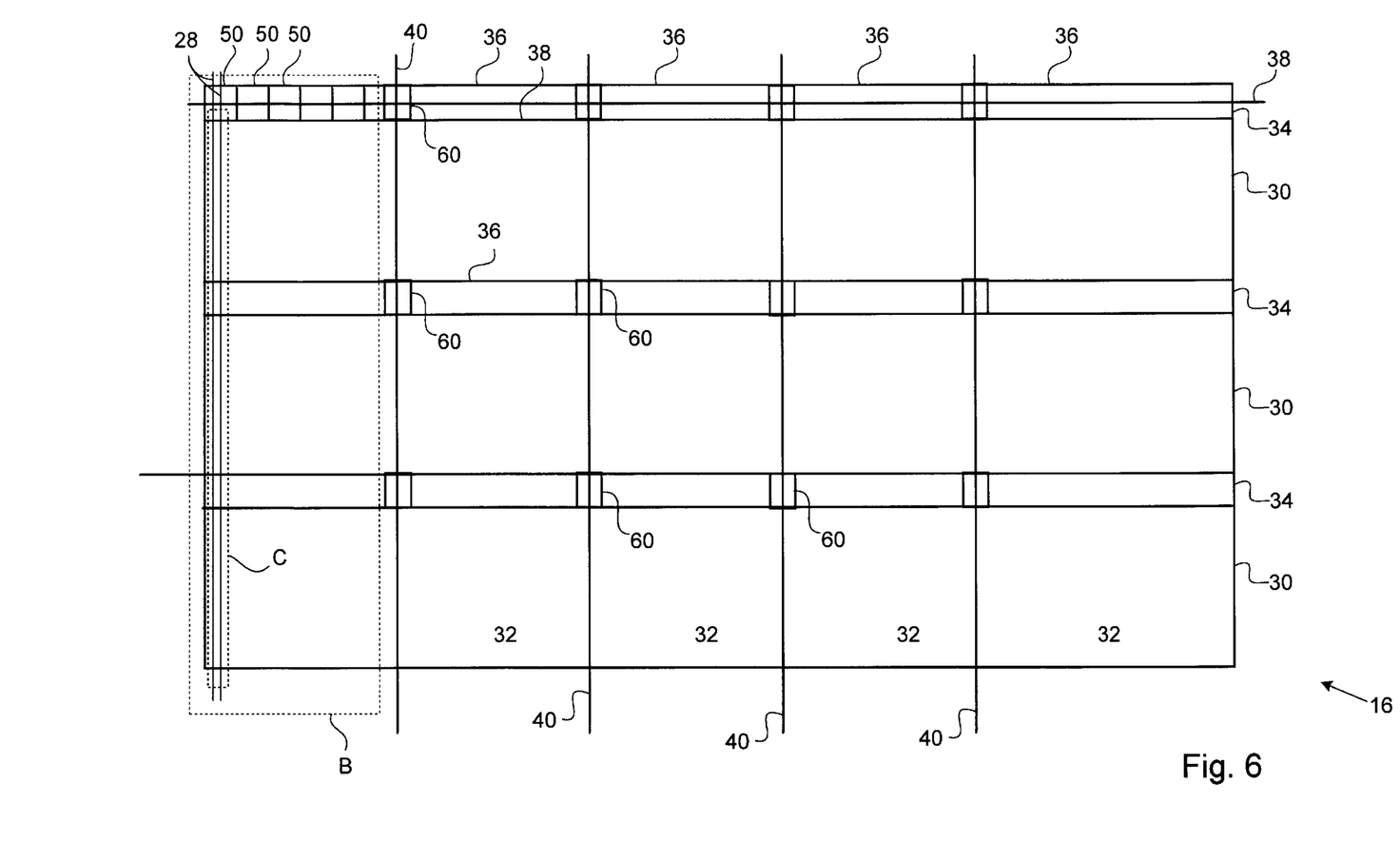
FIG. 6 is a block diagram of the second embodiment of the memory array of the present invention.

FIG. 6 is a block diagram of the second embodiment of the memory array 16 in FIGS. 2 and 3. Memory array 16 of FIG. 6 includes a plurality of memory banks 30. Each memory bank 30 includes a plurality of memory segments 32. Each memory bank 30 is associated with a sense amplifier bank 34. Each sense amplifier bank 34 includes a plurality of local sense amplifier segments 36. Each local sense amplifier 36 is associated with a memory segment 32 of the memory bank 30.

As it is further illustrated in FIG. 6, a local I/O line 38 is provided for each local sense amplifier segment 36. In addition, memory array 16 includes a plurality of global I/O lines, each coupled to the local I/O lines 38 associated with a column of memory segments 32. For example, the first global I/O 40, the first from the left in FIG. 6, is connected to the local I/O lines 32 associated with memory segments 32 that are grouped in box B.

Each local sense amplifier segment 36 includes a plurality of sense amplifiers 50. The output of each sense amplifier 50 is connected to the associated local I/O line 38. The number of sense amplifiers 50 in each local sense amplifier segment 36 depends on the number of memory cells in the corresponding memory segment 32. For example, if memory segment 36 includes 128 memory cells, the number of sense amplifier 50 will also be 128.

As mentioned before with respect to FIG. 1, memory array 16 includes a pair of complementary bit lines 28 for each column of memory cells. For illustration purposes, a pair of complementary bit lines 28 are shown in FIG. 6. In FIG. 6, a exemplary column of memory segments 32 and their corresponding local sense amp bank 36 is distinguished by box C. Memory 16 further includes a plurality of second stage amplifiers (global amplifiers) 60. Each second stage amplifier 60 is provided between each local I/O line 38 and the corresponding global I/O line 40.

It should be apparent to one knowledgeable in the art that memory 16 can include more that four memory banks that are shown in FIG. 6. Furthermore, each memory bank can include more than six memory segments that are shown in FIG. 6. FIG. 6 is provided for illustrative purposes and should not be considered as a limiting factor.

Figure 7:
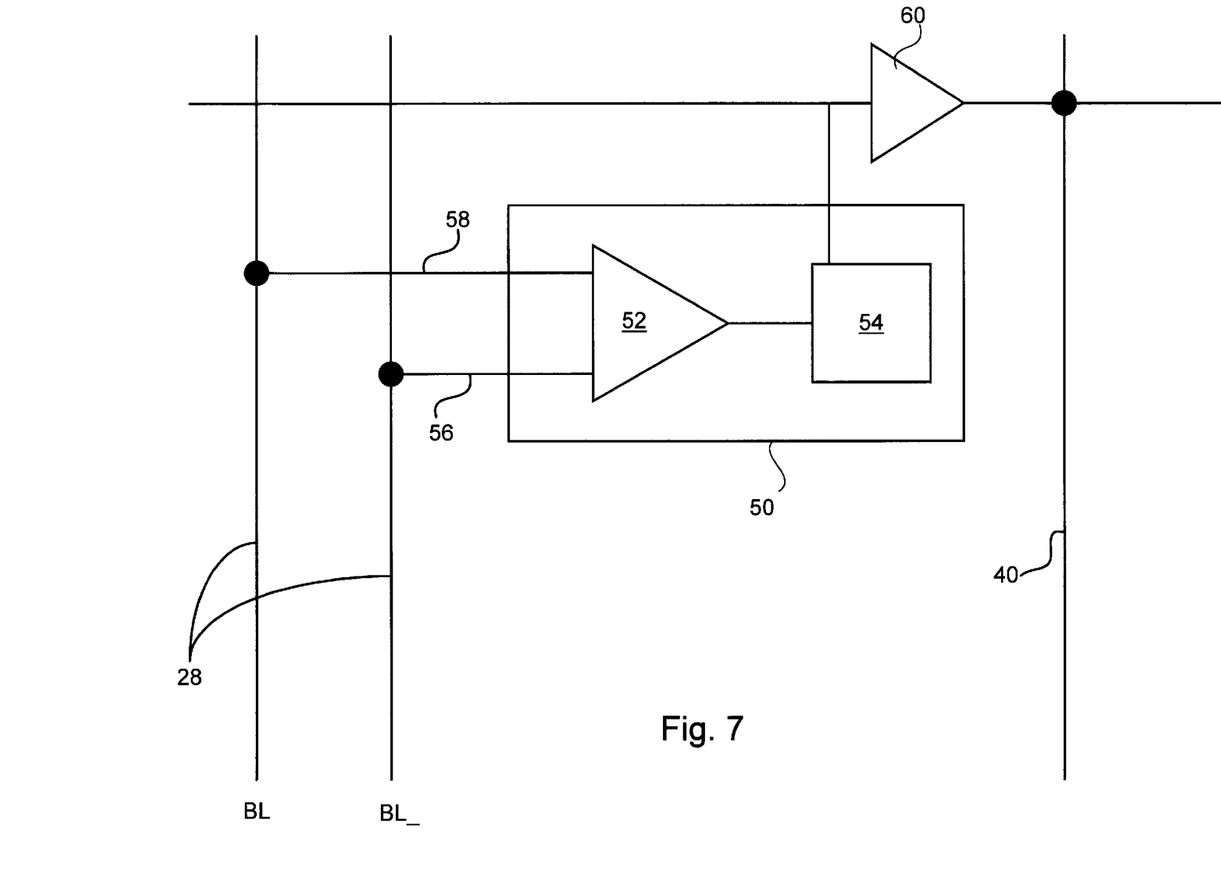
FIG. 7 is a schematic diagram illustrating the connection between the sense amp., local I/O line, second stage amplifier, and global I/O line of the present invention.

FIG. 7 is a schematic diagram in which the connection between a typical sense amplifier 50, a local I/O line 38, a second stage amplifier 60, and a global I/O line 40 is illustrated. The sense amplifier 50 includes a differential amplifier 52 and a latch 54. The inputs 56 and 58 of the differential amplifier 52 are connected to the bit line BL and inverse bit line BL_ of the complementary bit line pair 28. As mentioned above, the information will be present on only one of the bit lines, BL or BL_. The output of the differential amplifier 52 is latched in latch 54. Latch 54 places the information on to the local I/O line 38 by driving it. The information on local I/O is then amplified for the second time by the second stage amplifier 60 and placed on the global I/O 40.

As discussed above, the size of the differential amplifier 52 is smaller than those conventionally used. On the other hand, the second stage amplifier 60 can be much larger without any effect on the overall size of the memory chip. As a result, the second sage amplifier 60 can drive a much larger impedance very fast.

Figure 8:
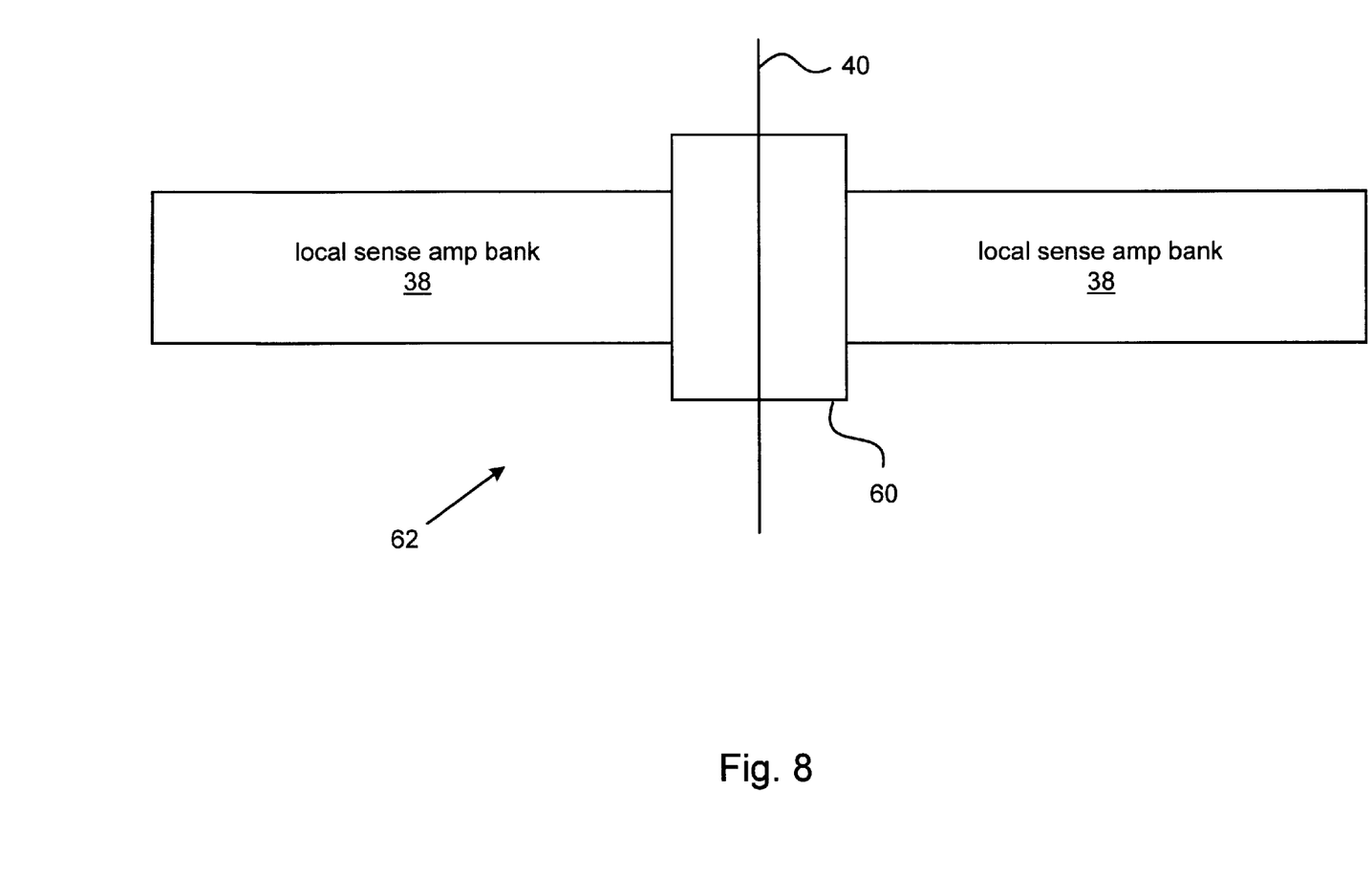
FIG. 8 is a block diagram illustrating the location of the second stage amplifier according to the present invention

Referring to FIG. 6, it can be seen that each second stage amplifier 60 is implemented in an space between two adjacent local sense amplifier segments 36 in sense amplifier bank 34. The location of the second stage amplifier 60 is more clearly illustrated in FIG. 8. As it is shown in FIG. 8, the second stage amplifier 60 is provided in space 62. Space 62 corresponds to the area within the memory array where a conductive layer is stitched to the wordlines. The purpose for stitching a conductive layer to the wordlines is known to one knowledgeable in the art and will not be discussed here. In the presently available random access memories, this space not utilized and is wasted, however. Thus, by providing the second stage amplifiers 60 in space 62, the present invention takes advantage of an area that has been historically wasted and provides a second opportunity for amplifying the sensed information without any penalty, such as an increase in the die size.

Figure 9:
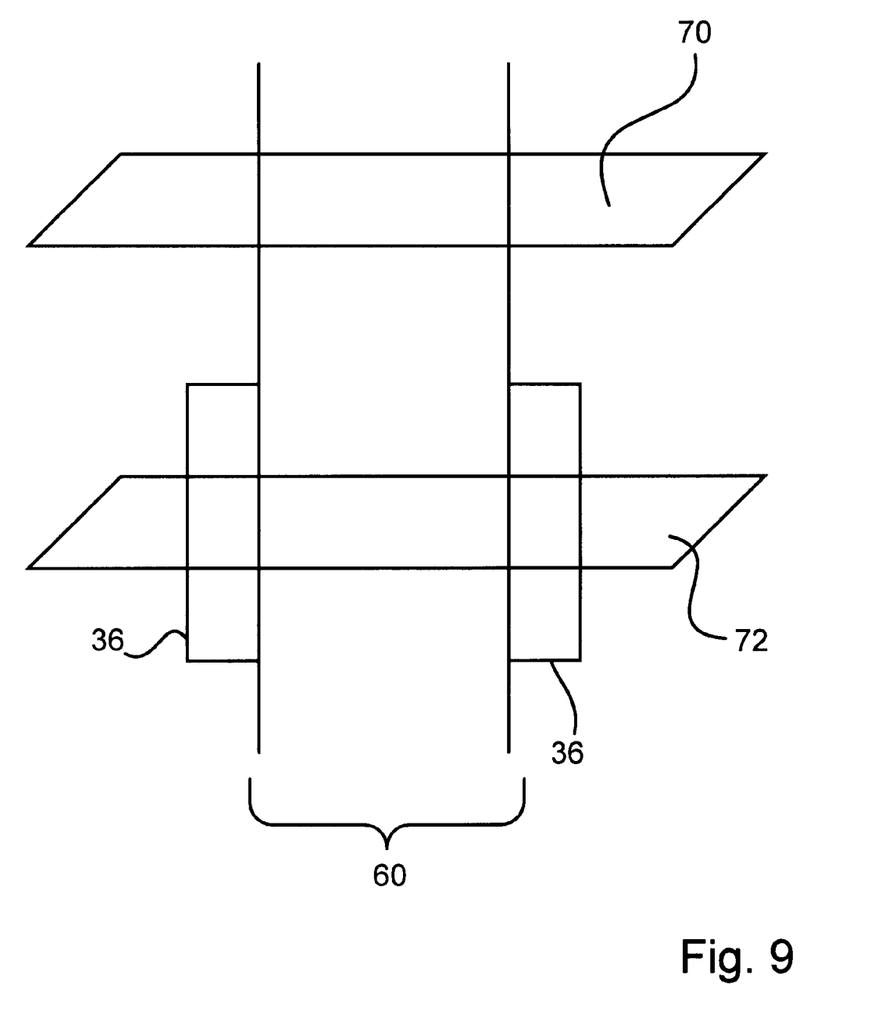
FIG. 9 illustrates a portion of the memory array according to the present invention.

Referring to FIG. 9, a portion of the memory array according to the present invention is illustrated. As illustrated in FIG. 9, a conductive layer 70 is stitched to poly layer (word line) 72 in area 62. Furthermore, it is illustrated that area 62 is between the two local sense amplifier segments 36. Although, only one connection between conductive layer 70 and poly layer 72 is illustrated in FIG. 9, it is apparent to one knowledgeable in the art that this is illustrative of the connections between the two layers shown in FIG. 9.

The operation of the random access memory 10 that includes the memory array 16 of FIG. 6 will now be described with reference to FIGS. 5 and 6. A read operation will be described for illustration purposes.

In a read operation, the external address is decoded by address decoder 14. The address decoder 14 generates a row select signal and a column select signal. The row select signal causes the information stored in the memory cells in the selected row to be placed on the corresponding bit line 28. The information on the bit line 28 is then sensed by the corresponding sense amplifier 50. The column select signal generated by the address decoder 14 determines which memory cell in the selected row is selected. Once this signal is activated, the sense amplifier associated with the selected memory cell will drive the corresponding local I/O line 38. The information on the local I/O line 38 is then amplified by the second stage amplifier 60 and placed on the global I/O line 40. The information on the global I/O line is now available to the outside circuitry. By providing a large second stage amplifier, the present invention minimizes the time to drive the global I/O lines.

Figure 10:
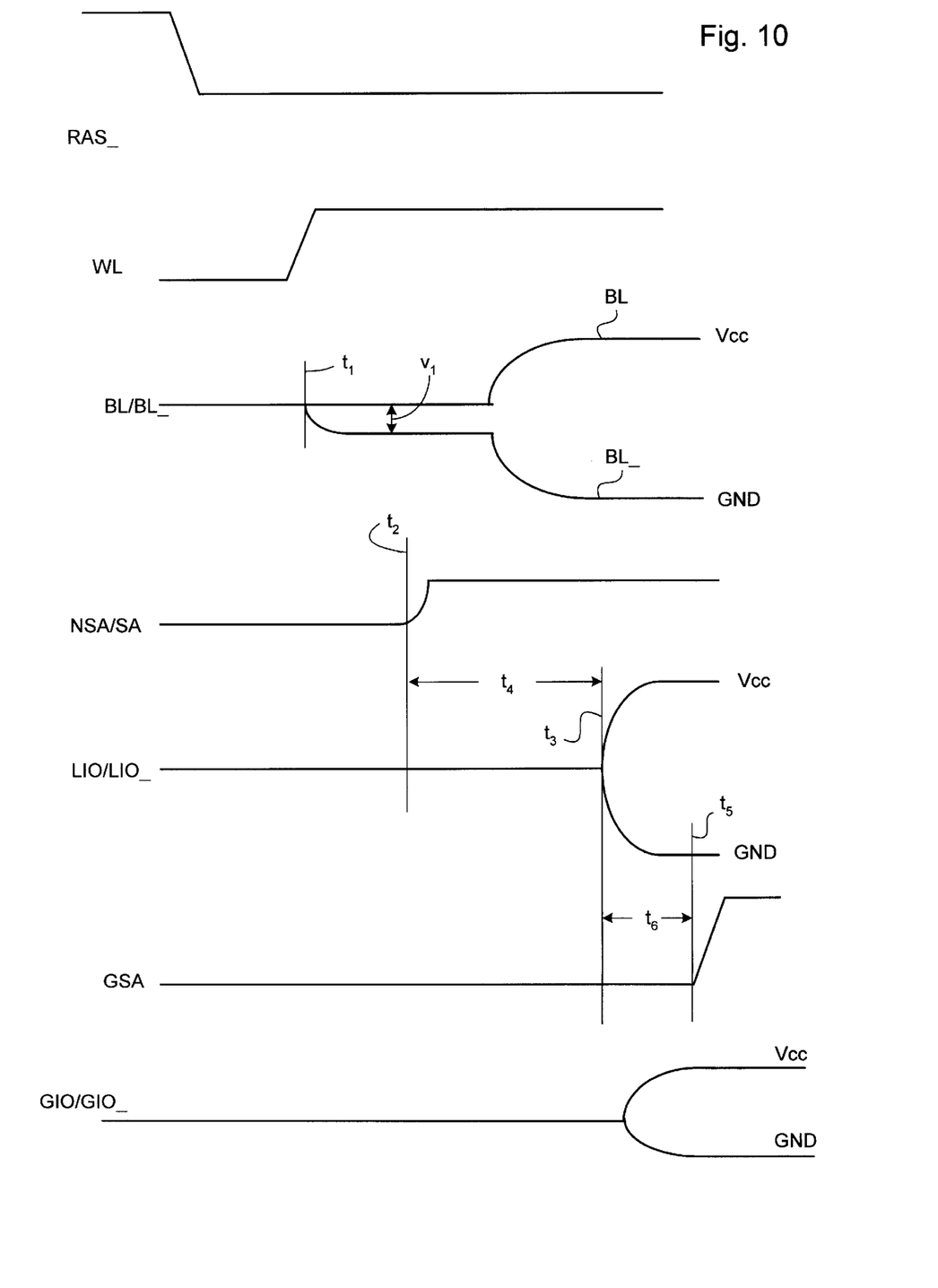
FIG. 10 is a timing diagram corresponding to a typical read operation in a random access memory including the second embodiment of the present invention.

Referring now to FIG. 10, a timing diagram corresponding to the read operation is illustrated. As shown in FIG. 10, the read operation starts with the active low RAS_ signal activated. Next, the WL signal goes high to activate the memory cells associated with the particular word line. Thereafter, at time t1, the information stored in the selected memory cell will be placed on BL or BL_. As mentioned above, either BL or BL_ is associated with the activated word line.

In the FIG. 10, the information is shown to be present on BL_. The stored information is represented by the v1, which is the difference between the voltages on BL and BL_. At time t2, the SA signal goes high to trigger the sensing of the information on BL_. As mentioned above, the voltages on BL and B_ are differentially sensed. At time t3, the sensed information is placed on local I/O and local I/O_(LI/O and LI/O_). Thereafter at time t5, the GSA signal goes high to enable the second stage amplification of the information on the LI/O and LI/O_. The information is then amplified and placed on the global I/O. As mentioned above, the present invention reduces the time it takes to drive the I/O lines. Thee two drive times are represented by t4 and t6 in FIG. 10, which are minimized by the second embodiment of the present invention.

Figure 11:
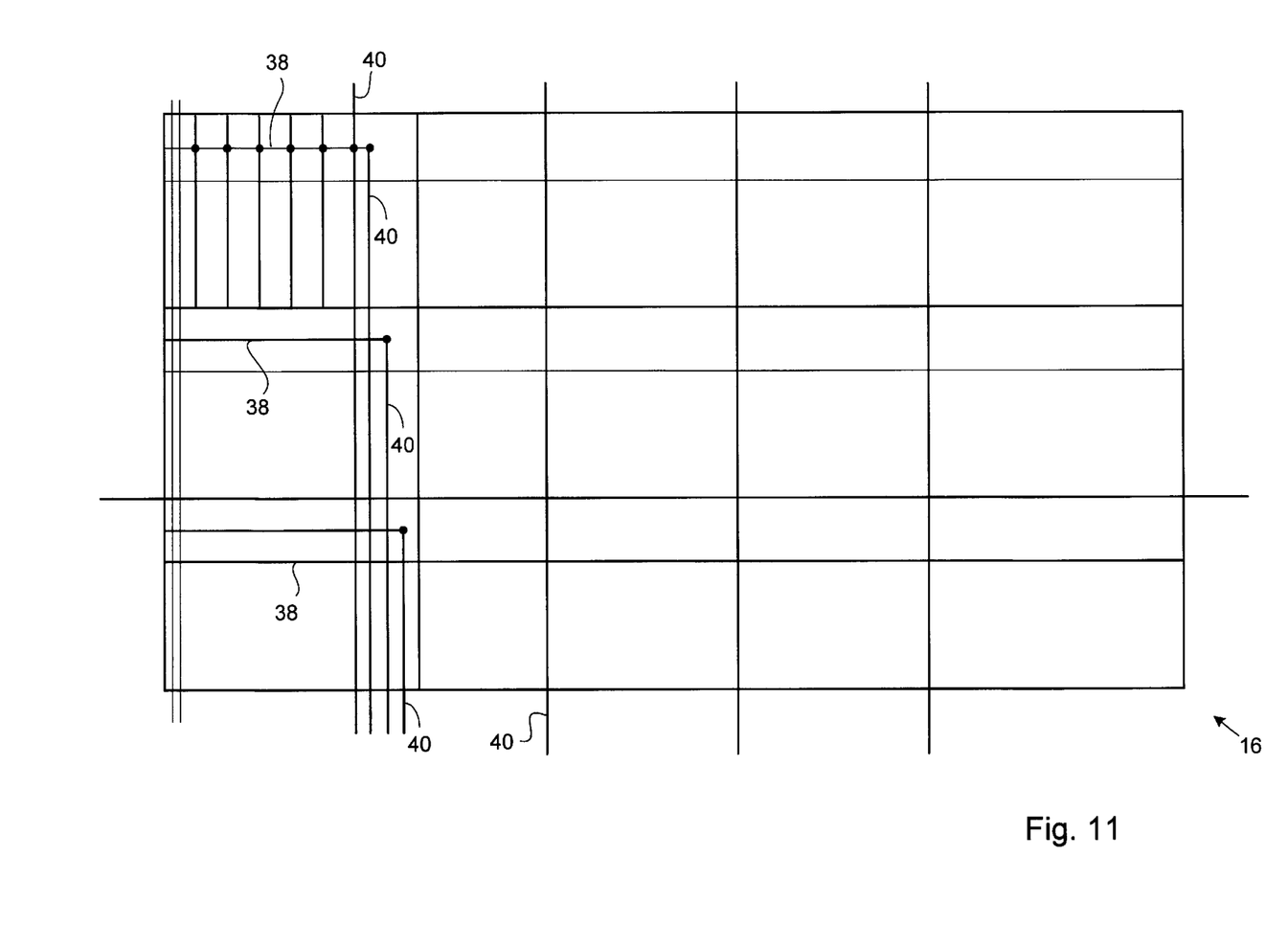
FIG. 11 is a block diagram of the third embodiment of the memory array of the present invention.

FIG. 11 is a third embodiment of the memory array according to the present invention. The memory array in FIG. 11 includes all the elements of memory array 16 in FIG. 6. In addition, it includes a global I/O line 40 for every local I/O line 38. As discussed above, to provide the global I/O lines, the present invention utilizes a conductive layer that is parallel to the semiconductor area and extends over the entire area. The use of this conductive layer enables the present invention to provide a plurality of global I/O lines without increasing the chip area. Although, the second stage amplifiers are not shown in FIG. 11, it is understood that each local I/O line is connected to a global I/O line through a second stage amplifier.

The present invention is now described with reference to specific embodiments. It should be understood that various alternatives to the embodiments of the present invention may be employed in practicing the invention. Therefore, it is intended that the following claims define the scope of the invention and that structures within the scope of these claims and equivalents be covered thereby.

What is claimed is:

1. A random access memory having a memory array, said memory array including memory cells arranged in rows and columns, wherein each intersection of a row and a column defines a memory cell, said memory array being subdivided into a plurality of memory banks, each said memory bank being subdivided into memory segments including a plurality of memory cells, said memory segments being arranged in rows and columns in said memory array wherein each said memory bank comprises a row of said memory segments, said random access memory comprising:

a plurality of local input/output (I/O) lines, each associated with and coupled to the memory cells in an associated memory segment;

a plurality of sensing banks, each associated with one of said memory banks, each said sensing bank including a plurality of sub-banks, said sub-banks forming rows and columns in said memory array wherein each said sensing bank comprises a row of said sub-banks, each said sub-bank being associated with one of said memory segments, each said sub-bank including a plurality of sense amplifiers associated with and coupled between one of said local I/O lines and the memory cells in said associated memory segment, wherein the effective RC impedance of each said local I/O line associated with one said sub-bank in one said sensing bank being less than the aggregate effective RC impedance of all said local I/O lines associated with said one said sensing bank;

a plurality of global input/output (I/O) lines, each associated with and coupled to the local I/O lines associated with one said column of said sub-banks.

2. The random access memory of claim 1, further comprising a plurality of amplifier circuitry, each coupled between one of said local I/O lines and the global I/O line associated with said one of said local I/O lines.

3. The random access memory of claim 1, further comprising a pair of bit lines associated with each column of said memory cells in said memory array, and wherein each said sense amplifier associated with one of said memory cells and the local I/O line associated with said memory cell is coupled between the pair of said bit lines associated with said memory cell and said local I/O line associated with said memory cell.

4. The random access memory of claim 2, wherein each of said amplifier circuitry is provided in an area between two adjacent sub-banks.

5. The random access memory of claim 4, wherein the area between two adjacent sub-banks includes a wordline stitch area.

6. The random access memory of claim 1 further comprising a plurality of global input/output (I/O) lines, each coupled to one of said local I/O lines; and a plurality of amplifier circuitry, each coupled between one local I/O line and an associated global I/O line.

7. The random access memory of claim 1 wherein said global I/O line being disposed parallel to said bit lines in a conductive layer parallel to the plane of said memory array.

8. The random access memory of claim 6 where said global I/O line being disposed parallel to said bit lines in a conductive layer parallel to the plane of said memory array.

9. A random access memory having a memory array, said memory array including a plurality of memory banks, each memory bank including memory cells arranged in rows and columns, wherein each intersection of a row and a column defines a memory cell, said memory array further including word lines and bit lines, said memory banks further including a plurality of memory segments comprising memory cells, said memory segments being arranged in rows and columns in said memory array wherein each said memory bank comprises a row of said memory segments, said random access memory comprising:

a plurality of local input/output (I/O) lines, each associated with and coupled to the memory cells of one memory segment;

a plurality of sensing banks, each associated with one of said memory banks, each sensing bank including a plurality of sub-banks, said sub-banks forming rows and columns in said memory array wherein each said sensing bank comprises a row of said sub-banks, each sub-bank including a plurality of sense amplifiers coupled between one of said local I/O lines and the memory cells of the memory segment associated with the local I/O line;

a plurality of global input/output (I/O) lines, each associated with and coupled to the local I/O lines associated with a column of sub-banks;

wherein the effective RC impedance of each local I/O line associated with a sub-bank in a sense bank being less than the aggregate effective RC impedance of all local I/O lines associated with said sense bank.

10. The random access memory of claim 9, further comprising a plurality of amplifier circuitry, each coupled between one of said local I/O lines and the global I/O line associated with said one of said local I/O lines.

11. The random access memory of claim 9, wherein each of said sense amplifiers being coupled between a pair of bit lines and the associated local I/O line.

12. The random access memory of claim 9, wherein each of said amplifier circuitry is provided in an area between two adjacent local sensing banks.

13. The random access memory of claim 10, wherein each of said amplifier circuitry being provided in an area between two adjacent sub-banks.

14. The random access memory of claim 13, wherein the area between two adjacent sub-banks includes a wordline stitch area.

15. The random access memory of claim 9, wherein said global I/O line being disposed parallel to said bit lines in a conductive layer parallel to the plane of said memory array.

16. A random access memory having a memory array, said memory array including a plurality of memory banks, each memory bank including memory cells arranged in rows and columns, wherein each intersection of a row and a column defines a memory cell, said memory array further including word lines and bit lines, each said bit line associated with a column of said memory cells in said memory array, said memory banks further including a plurality of memory segments, the random access memory comprising a plurality of local input/output (I/O) lines, each associated with and coupled to the memory cells of one memory segment; a plurality of sensing banks, each associated with one of said memory banks, each sensing bank including a plurality of sub-banks, each sub-bank including a plurality of sense amplifiers coupled between one of said local I/O lines and the memory cells of the memory segment associated with the local 1 I/O line; and a plurality of global input/output (I/O) lines, one said global I/O line for each said local I/O line and each coupled to one of said local I/O lines; wherein the effective RC impedance of each local I/O line associated with a sub-bank in a sense bank being less than the aggregate effective RC impedance of all local I/O lines associated with said sense bank.

17. The random access memory of claim 16, further comprising a plurality of amplifier circuitry, each coupled between one of said local I/O lines and the global I/O line associated with said one of said local I/O lines.

18. The random access memory of claim 16, wherin each of said said amplifiers beng coupled between a pair of bit lines and the associated local I/O line.

19. The random access memory of claim 17, wherein each of said amplifier being provided in an area betwwen two adjacent sub-banks.

20. The random access memory of claim 19, wherein the area betwwen two adjacent sub-banks includes a wordline stitch area.

21. The random access memory of claim 16, wherein said global I/O line being disposed parallel to said bit lines in a conductive layer parallel to the plane of said memory array.

* * * * *